United States Patent [19]
Hashio et al.

[11] Patent Number: 5,733,371
[45] Date of Patent: Mar. 31, 1998

[54] APPARATUS FOR GROWING A SINGLE CRYSTAL

[75] Inventors: Katsushi Hashio; Shin-ichi Sawada; Masami Tatsumi, all of Itami, Japan

[73] Assignee: Sumitomo Electric Industries, Ltd., Osaka, Japan

[21] Appl. No.: 616,350

[22] Filed: Mar. 15, 1996

[30] Foreign Application Priority Data

Mar. 16, 1995 [JP] Japan .................... 7-057099
Mar. 4, 1996 [JP] Japan .................... 8-045852
Mar. 4, 1996 [JP] Japan .................... 8-045853

[51] Int. Cl.$^6$ .................................... C30B 35/00
[52] U.S. Cl. .................... 117/208; 117/200; 117/900
[58] Field of Search .................... 117/200, 201, 117/202, 204, 900, 902, 17, 31, 208

[56] References Cited

U.S. PATENT DOCUMENTS

| | | | |
|---|---|---|---|
| 4,167,554 | 9/1979 | Fisher | 117/209 |
| 4,211,600 | 7/1980 | Cole | 117/17 |
| 4,264,385 | 4/1981 | Fisher | 117/17 |
| 4,539,067 | 9/1985 | Washizuka et al. | 117/15 |
| 4,874,458 | 10/1989 | Nishizawa | 117/17 |
| 5,394,830 | 3/1995 | Azad | 117/17 |
| 5,471,943 | 12/1995 | Scheel | 117/20 |

FOREIGN PATENT DOCUMENTS

| | | |
|---|---|---|
| 0 219 966 | 4/1987 | European Pat. Off. . |
| 0 538 048 | 10/1992 | European Pat. Off. . |
| 0 555 040 | 8/1993 | European Pat. Off. . |
| 90/04054 | 4/1990 | WIPO . |

OTHER PUBLICATIONS

*In–Situ Observation of Solid–Liquid Interface Shape by X-Ray Radiography During Silicon Single Crystal Growth,* 2300 Journal of Crystal Growth 91 (1988) Sep., No. 4, Amsterdam, The Netherlands.

*Primary Examiner*—Felisa C. Garrett
*Attorney, Agent, or Firm*—Wenderoth, Lind & Ponack

[57] ABSTRACT

According to the present invention, in the growth of an oxide single crystal or a compound semiconductor single crystal such as GaAs single crystal by the CZ method or LEC method, the tendency of concave solid-liquid interface shape at the periphery of the growing crystal can be suppressed to prevent polycrystallization without localized heating of the solid-liquid interface, while controlling the diameter of the growing crystal even when using a crucible with a larger diameter, thus improving the yield of crystal on a commercial scale. In the invention, the end of a cylindrical body having an inner diameter of larger than the predetermined diameter of straight part of the growing crystal is immersed in the raw material melt or liquid encapsulant and the crystal is pulled while preventing the shape of the solid-liquid interface from becoming concave by controlling the rotation rate of at least one of a crucible holding the raw material melt, the growing crystal and cylindrical body.

10 Claims, 13 Drawing Sheets

APPARATUS FOR GROWING A SINGLE CRYSTAL

BACKGROUND OF THE INVENTION

1. Field of the Invention

This invention relates to a method and apparatus for the growth of an oxide single crystal or a semiconductor single crystal by the Czochralski method (hereinafter referred to as the CZ method) or the liquid encapsulated Czochralski method (hereinafter referred to as the LEC method). In particular, it is concerned with a method and apparatus for the Czochralski growth of gallium arsenide (GaAs) bulk single crystals to be used for integrated circuits, electronic devices for communication, optical devices, etc.

2. Description of the Related Art

Generally, a single crystal bulk such as composed of GaAs is grown by the CZ method or LEC method, but there arises a problem that polycrystals partly occur during the growth.

FIG. 10 is a schematic view of an apparatus for carrying out the LEC method in the prior art. At the center of a high pressure chamber 13, a susceptor 14-fitted crucible 1 is supported by a lower shaft 6. The crucible 1 holds a raw material melt 3 and a liquid encapsulant 5. A seed crystal 9 held by an upper pulling rod 7 is immersed in the raw material melt 3, followed by pulling a single crystal 4. A heater 10 is arranged around the raw material melt 3. A heater 11 is arranged around the single crystal 4 and a heat insulator 12 is arranged inside the high pressure chamber 1.

The reason for the polycrystallization, as described above, is considered to consist in that the shape of the solid-liquid interface (S-L) of the growing crystal is concave to the melt near the periphery of the growing crystal. Dislocations (D) propagated along a direction perpendicular to the solid-liquid interface accumulate in the periphery, thus rendering polycrystalline (P), as shown in FIG. 11. In order to prevent formation of such polycrystals, therefore, it is necessary to prevent the solid-liquid interface near the periphery of the growing crystal from becoming concave. As a method of preventing the solid-liquid interface from becoming concave in the CZ method or LEC method, it has been proposed to increase the power of a heater arranged in the vicinity solid-liquid interface as much as possible to locally heat the side of the growing crystal and to suppress heat flow laterally from the crystal [HITACHI CABLE REVIEW No. 9 (1990), 55].

However, the above described method has the following problems:

1. In order to locally heat the side of the growing crystal, it is necessary to shorten the length of the heater to some extent and apply a larger power. Consequently, the current density flowing through the heater is very large and the service life of the heater is very short.

2. Since heating of the heater is carried out through a susceptor made of carbon, the crystal is uniformly heated in the vertical direction by heat conduction and substantial local heating is impossible. In the case of the LEC method, furthermore, $B_2O_3$ used as an encapsulant absorbs the most part of heat radiation and accordingly, it is impossible to effectively heat the most important region, i.e. in the vicinity of the solid-liquid interface.

3. Since not only the periphery part of the crystal but also the whole of the crystal side surface are heated, heat flow toward the side from the crystal is wholly suppressed and the order of convex to the melt of the solid-liquid interface increases, so large residual strain is contained in the growing crystal and uniformity of the property of a wafer cut out of the crystal is poor.

4. In the CZ method or LEC method, controllability of the diameter of the growing crystal is strongly dependent on the temperature distribution on the surface of the raw material melt. In the prior art, however, it is difficult to stably maintain the above described temperature distribution with good reproducibility and when using a large amount of a raw material at once and using a crucible with a large diameter for high productivity of the single crystal, in particular, control of the diameter further becomes difficult with an increase of the gap between the growing crystal and crucible wall.

5. The LEC method is ordinarily used for the growth of a single crystal containing a volatile element, but in this method, the surface temperature cannot be so raised because a growing crystal pulled out of the liquid encapsulant is damaged through evaporation of the volatile element from the surface. Consequently, the temperature gradient in the axial growth direction is restricted to a higher region (temperature gradient in growth of GaAs single crystal: ordinarily about 100° C./cm) and a crystal with many crystal defects (dislocations) and much residual strain can only be grown because of the occurrence of large thermal stress in the growing crystal.

6. Thus, the growth is carried out using a large amount of a liquid encapsulant so that most of the growing crystal is covered with the liquid encapsulant, in order to practice the LEC method under a small temperature gradient (hereinafter referred to as Fully Encapsulated Cz method, i.e. FEC method). But because of the very small heat conductivity of the liquid encapsulant $B_2O_3$, response of the temperature on the surface of the raw material melt is deteriorated and consequently, control of the diameter of the crystal is extremely difficult. This cannot therefore be said to be a useful growth method.

SUMMARY OF THE INVENTION

It is an object of the present invention to provide an improved method for the Czochralski growth of an oxide or semiconductor single crystal, in particular, a gallium arsenide bulk single crystal to be used for integrated circuits, electronic devices for communication, optical devices, etc.

It is another object of the present invention to provide a method and apparatus for the growth of a single crystal with less crystal defects, whereby the above described disadvantages of the prior art can be overcome and the tendency of concave solid-liquid interface shape at the periphery of the growing crystal can be suppressed to prevent polycrystallization thereof without localized heating of the solid-liquid interface, while controlling the diameter of the growing crystal even when using a crucible with a larger diameter.

It is a further object of the present invention to provide a method and apparatus for the growth of a single crystal with less crystal defects, whereby the above described disadvantages of the prior art can be overcome and the tendency of becoming concave at the periphery of the growing crystal can be suppressed to prevent formation of polycrystals without localized heating of the solid-liquid interface.

These objects can be attained by a method for the growth of a single crystal comprising pulling a crystal out of a raw material melt by the CZ method or LEC method, wherein the end of a cylindrical body having an inner diameter of larger than the predetermined diameter of straight part of the growing crystal is immersed in the raw material melt or liquid encapsulant and the crystal is pulled while preventing the shape of the solid-liquid interface from becoming concave by controlling the rotation rate of at least one of a crucible holding the raw material melt, the growing crystal and cylindrical body. An apparatus for practicing this method is also provided.

In the present invention, the single crystal generally consists of a semiconductor single crystal, i.e. a Group IV element of the Periodic Table, such as Si, a Group III-V compound semiconductor such as GaAs, InP, InGaAs, etc., a Group II-VI compound semiconductor such as ZnSe, CdTe, etc., or an oxide single crystal such as $Bi_{12}SiO_{20}$ (BSO), $LiNbO_3$ (LNO), $Li_2B_4O_7$ (LBO), etc.

BRIEF DESCRIPTION OF THE DRAWINGS

The accompanying drawings illustrate the present invention in more detail.

DETAILED DESCRIPTION OF THE PREFERRED EMBODIMENT(S)

Figure 1:
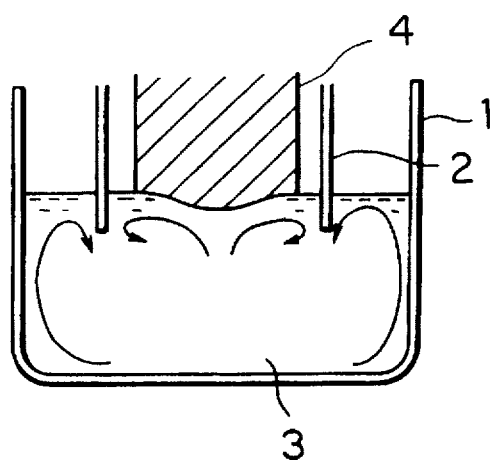
FIG. 1 is a schematic view illustrating how convection of a raw material melt is changed by the cylindrical body according to the present invention.

The inventors have made various efforts to improve a method for the growth of a single crystal by the CZ method or LEC method and consequently, have found a means for preventing the solid-liquid interface from becoming concave at the periphery while realizing good controllability of the diameter. The present invention is accomplished based on this finding.

The specified constructions of the invention will be summarized below:

(1) A method for the growth of a single crystal comprising pulling a crystal out of a raw material melt by the CZ method or LEC method, wherein the end of a cylindrical body having an inner diameter of larger than the predetermined diameter of a straight part of the growing crystal is immersed in the raw material melt or liquid encapsulant and the crystal is pulled while preventing the shape of the solid-liquid interface from becoming concave by controlling the rotation rate of at least one of a crucible holding the raw material melt, the growing crystal and cylindrical body.

(2) The method for the growth of a single crystal, using the LEC method, as described in the above (1), wherein the end of the cylindrical body is immersed in the raw material melt.

(3) The method for the growth of a single crystal, as described in the above (1), wherein the end of the cylindrical body is immersed in the liquid encapsulant.

(4) The method for the growth of a single crystal, as described in the above (1) or (2), wherein the cylindrical body has an inner diameter of larger by 5 to 30 mm, preferably 5 to 20 mm than the predetermined diameter of a straight part of the growing crystal.

(5) The method for the growth of a single crystal, as described in the above (1), (2) or (4), wherein the cylindrical body is slightly bent inward to prevent the natural convection outside the cylindrical body from flowing into the inner region of the cylindrical body.

(6) The method for the growth of a single crystal, as described in the above (1), (2), (4) or (5), wherein the relative rotation rate of the cylindrical body and upper pulling rod is controlled to control the diameter of the growing crystal.

(7) The method for the growth of a single crystal, as described in any one of the above (1) to (6), wherein in place of the cylindrical body, a casing having a cross-sectional shape as that of the growing crystal is used.

(8) The method for the growth of a single crystal, as described in any one of the above (1) to (6), wherein in the growth of a crystal for cutting a wafer in a direction not perpendicular to the growth axis, a casing having an oval shape in cross section is used.

(9) The method for the growth of a single crystal, as described in any one of the above (1) to (8), wherein the rotation of the cylindrical body is stopped and the growing crystal is pulled up.

(10) The method for the growth of a single crystal, as described in any one of the above (1) to (8), wherein the growing crystal is pulled up while rotating the cylindrical body and pulling rod as one body.

(11) The method for the growth of a single crystal, as described in any one of the above (1) to (8), wherein the growing crystal is pulled up while rotating the cylindrical body with a rotation rate different from that of the pulling rod and crucible.

(12) The method for the growth of a single crystal, as described in any one of (1) to (11), wherein the cylindrical body is heated.

(13) The method for the growth of a single crystal, as described in any one of (1) to (12), wherein the upper end of the cylindrical body is closed and a vapor pressure of a volatile element constituting the growing crystal is applied to the cylindrical body.

(14) The method for the growth of a single crystal, as described in the above (1) or (2), wherein the cylindrical body has an inner diameter of larger by 5 to 30 mm, preferably 5 to 20 mm, than the predetermined diameter of a straight part of the growing crystal, the growing crystal is rotated with a relative rotation rate of 0 to 5 ppm, preferably 0 to 3 ppm, to the cylindrical body, the cylindrical body is rotated with a relative rotation rate of at least 5 ppm, preferably 10 to 30 ppm, to the crucible, whereby a single crystal is pulled upward while preventing the solid-liquid interface from becoming concave.

(15) The method for the growth of a single crystal, as described in the above (3), wherein the cylindrical body has an inner diameter of larger by 5 to 30 mm, preferably 5 to 20 mm, than the predetermined diameter of a straight part of the growing crystal, the distance from the raw material melt surface to the end of the cylindrical body immersed in the liquid encapsulant is at most 30 mm, preferably at most 10 mm, the growing crystal is rotated with a relative rotation rate of 0 to 5 ppm, preferably 0 to 3 ppm, to the cylindrical body, the cylindrical body is rotated with a relative rotation rate of at least 5 ppm, preferably 10 to 30 ppm, to the crucible, whereby a single crystal is pulled upward while preventing the solid-liquid interface from becoming concave.

(16) An apparatus for the growth of a single crystal by pulling a crystal out of a raw material melt by the CZ method or LEC method, comprising a cylindrical body, supported in such a manner that the end of the cylindrical body having an inner diameter of larger than the predetermined diameter of a straight part of the growing crystal is immersed in the raw material melt or a liquid encapsulant, a crucible for holding the raw material melt, supported by a lower shaft rod so as to be rotatable and vertically movable, a seed crystal supported by the lower end of an upper pulling rod so as to be rotatable and vertically movable and a means for controlling the rotation rate and vertically moving rates of the upper and lower shafts in accordance with change of the shape of the solid-liquid interface.

(17) The apparatus for the growth of a single crystal, as described in the above (16), wherein the cylindrical body is slightly bent inward to prevent the natural convection outside the cylindrical body in the raw material melt from flowing into the inner region of the cylindrical body.

(18) The apparatus for the growth of a single crystal, as described in the above (16) or (17), wherein the weight and shape of the cylindrical body is controlled in such a manner that the cylindrical body is floated on the raw material melt to satisfy the immersion condition.

(19) The apparatus for the growth of a single crystal, as described in any one of the above (16) to (18), wherein the cylindrical body is supported so as to be rotatable with the pulling rod as one body.

(20) The apparatus for the growth of a single crystal, as described in any one of the above (16) to (18), wherein the cylindrical body is supported so as to be rotatable independently of the upper and lower shafts.

(21) The apparatus for the growth of a single crystal, as described in the above (16), wherein the cylindrical body is fixed to a non-movable part of the growth apparatus.

(22) The apparatus for the growth of a single crystal, as described in any one of the above (16) to (21), wherein in place of the cylindrical body, a casing having a cross-sectional shape as that of the growing crystal is used.

(23) The apparatus for the growth of a single crystal, as described in any one of the above (16) to (22), wherein in the growth of a crystal for cutting a wafer in a direction not perpendicular to the growth axis, a casing having an oval shape in cross section is used.

(24) The apparatus for the growth of a single crystal, as described in any one of the above (16) to (23), wherein a means for heating the cylindrical body is additionally provided.

(25) The apparatus for the growth of a single crystal, as described in any one of the above (16) to (24), wherein as the cylindrical body, there is used a cylindrical body whose upper end is closed and a reservoir holding a volatile element constituting the growing crystal is arranged to be connected with the cylindrical body, in such a manner that the vapor pressure of a volatile element in the cylindrical body can be controlled by controlling the heater power of the reservoir.

Figure 4:
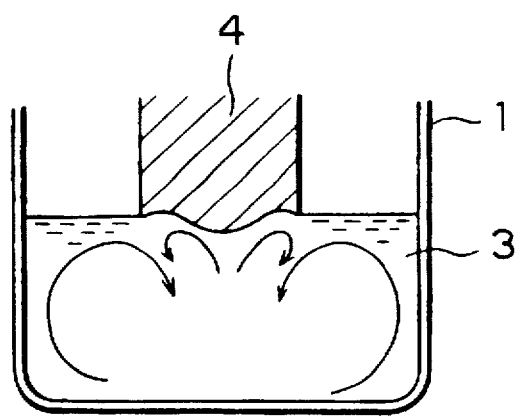
FIG. 4 is a schematic view illustrating how the solid-liquid interface near the periphery of a growing crystal is rendered concave by a convection in a raw material melt in the CZ method in the prior art.

The inventors have investigated the convection of a raw material melt 3 when a single crystal 4 is grown by the CZ method or LEC method and consequently, have found that there is a natural convection that rises near the side wall of a crucible 1 and flows toward the growing crystal 4 and a forced convection that whirls near the solid-liquid interface due to rotation of the crystal, as shown by arrows in FIG. 4. The melt temperature in the vicinity of the outer periphery of the solid-liquid interface is raised by these convections to render the periphery part of the solid-liquid interface concave to the melt.

The present invention has succeeded in preventing the periphery part of the solid-liquid interface from local temperature rising and preventing the solid-liquid interface from becoming concave by arranging a cylindrical body 2 round a growing crystal 4 and immersing the end thereof in a raw material melt 3, as shown in FIG. 1, thereby cutting off the natural convection near the surface of the raw material melt and extending the flow of the melt at a high temperature outside the growing crystal by a forced convection by the cylindrical body.

In the present invention, when crystal growth is carried out by immersing a cylindrical body in a raw material melt, the diameter of the growth crystal approaches the inner diameter of the cylindrical body and a meniscus formed between the growing crystal and the raw material melt is subject to a force from the cylindrical body, thus resulting in an effect of suppressing fluctuation of the diameter of the growing crystal. Since this force is changed by the relative rotation rate of the cylindrical body and growing crystal, however, it is desired to control the rotation rate of the cylindrical body and/or growing crystal so that the above described effect can be optimized.

Furthermore, when using a crucible with a large diameter, in general, it is difficult to control the diameter of the growing crystal, but according to the method of the present invention, control of the diameter is rendered possible even if a crucible with a large diameter is used for high productivity of crystal growth.

The immersion depth of the cylindrical body is not so important, since the effects of the cylindrical body according to the present invention in the case of immersing the end of the cylindrical, body in the raw material melt are not affected by the immersion depth in the practical range, but the inner diameter of the cylindrical body should preferably be adjusted to larger by 5 to 30 mm, more preferably 5 to 20 mm than the predetermined diameter of a straight part of the growing crystal.

Figure 2:
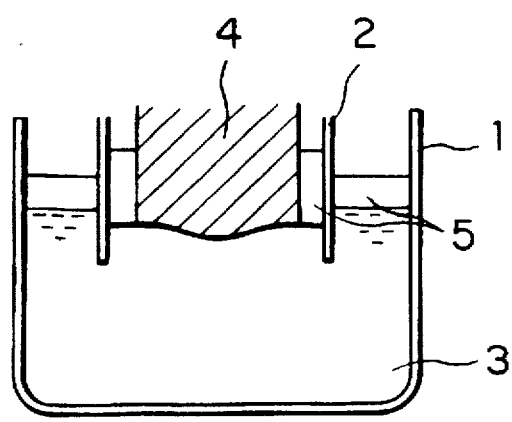
FIG. 2 is a schematic view illustrating the vicinity of the solid-liquid interface when the cylindrical body of the present invention is immersed in a raw material melt and a crystal with a straight part is pulled upward.

In the present invention, when a liquid encapsulant 5 is placed on a raw material melt 3, a cylindrical body 2 similar to that of FIG. 1 is immersed in the raw material melt 3 and a seed crystal fitted to an upper pulling rod (not shown) is immersed in the raw material melt 3, subjected to growth of a crystal and pulled upward to a straight part, as shown in FIG. 2, the thickness of the liquid encapsulant 5 in the cylindrical body 2 becomes considerably thicker than at the initial state, but the thickness of the outside liquid encapsulant is not changed, as shown in FIG. 2, resulting in a large difference in thickness of the liquid encapsulant between the inside and outside, and the surface of the raw material melt outside the cylindrical body is higher than the surface of the raw material melt inside the cylindrical body due to a pressure difference between the inside and outside the cylindrical body. Consequently, a wall of the raw material melt at a high temperature, having a high thermal conductivity, is formed outside the cylindrical body and above the solid-liquid interface to further improve the temperature stability near the solid-liquid interface.

Since the thickness of the liquid encapsulant can be made considerably thicker inside the cylindrical body independently of the diameter of a crucible when the straight part is pulled upward according to the present invention, furthermore, evaporation of the volatile element from the surface of the growing crystal can be prevented in a similar manner to the foregoing LEC method. Consequently, the temperature gradient near the solid-liquid interface can be decreased and the thermal strain in the crystal can largely be decreased. Even under such a state, there is no problem on control of the diameter of the growing crystal according to the method of the present invention, as described above, and accordingly, it is rendered possible to produce a single crystal excellent in crystallinity.

When the cylindrical body is heated, the liquid encapsulant inside the cylindrical body and/or the pulled crystal can well be kept warm to decrease the temperature gradient near the solid-liquid interface and accordingly, so the same effects as described above can be expected.

When the lower end of the cylindrical body is slightly bent inward to prevent the natural convection outside the cylindrical body from taking a round-about way inside the cylindrical body, thus resulting in a large cutting off effect of such a natural convection.

Figure 5:
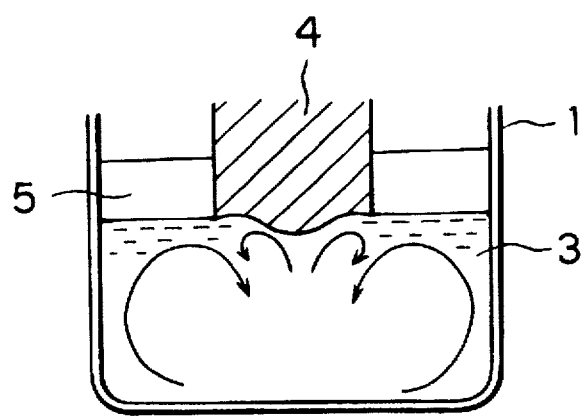
FIG. 5 is a schematic view illustrating the convection in a raw material melt in the LEC method.

For another preferred embodiment of the present invention using a liquid encapsulant, moreover, the inventors have made a detailed study on a natural convection of a raw material melt and a forced convection caused by rotation of a growing crystal, when the single crystal is grown while rotating the growing crystal and a crucible by the LEC method of the prior art, and consequently, it is found that concerning the flows of the raw material melt and liquid encapsulant, a convection (natural convection) due to the vertical temperature gradient in the crucible, a convection due to rotation of the crucible and a convection due to rotation of the growing crystal interact with each other and that the liquid encapsulant is rotated with a rotation rate as similar to that of the crucible as approaching it and a rotation rate as similar to that of the growing crystal as approaching it, but is strongly affected by the rotation of the crucible, since the crucible is contacted with the liquid encapsulant at a larger area. As a result, it is considered that in the raw material melt 3, the natural convection rising near the side wall of the crucible 1 and flowing toward the growing crystal 4 is dominant as shown by arrows in FIG. 5 and the forced convection caused by rotation of the growing crystal is restricted below the solid-liquid interface, since the rotation of the crucible and that of the liquid encapsulant having a larger influence and more affect than the rotation of the growing crystal. Accordingly, the melt temperature near the periphery of the solid-liquid interface becomes higher to render concave the solid-liquid interface at the periphery of the crystal.

Figure 3:
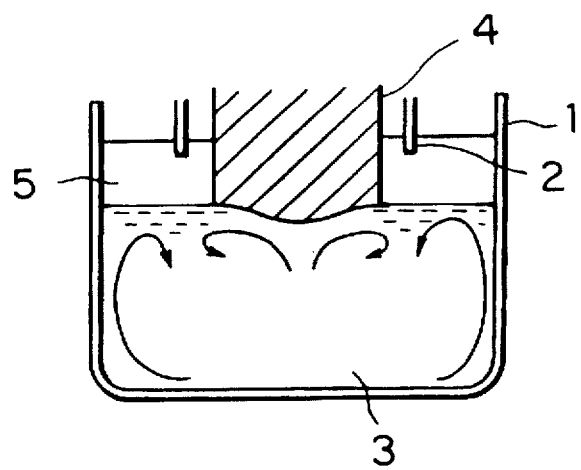
FIG. 3 is a schematic view illustrating the convection in a raw material melt when the lower end of the cylindrical body of the present invention is immersed in an encapsulant.

The inventors have further noted that a liquid encapsulant 5 such as $B_2O_3$ has a larger viscosity. Thus in the present invention, the lower end of a cylindrical body 2 arranged round a growing crystal 4 is immersed in the liquid encapsulant 5 as shown in FIG. 3, and such an extent that the liquid encapsulant affected by rotation of the crucible is moderated by (1) fixing the cylindrical body to a non-movable part in a growth apparatus, (2) rotating the cylindrical body with the growing crystal as one body or (3) rotating the cylindrical body independently of the growing crystal and crucible, whereby to suppress a natural convection of the raw material melt in the vicinity of the solid-liquid interface, to enlarge the range of a forced convection in the vicinity of the solid-liquid interface due to rotation of the growing crystal and to prevent the periphery of the solid-liquid interface from becoming concave.

That is, in the present invention, a natural convection near the surface of a raw material melt is weakened to enlarge the range of a forced convection near the solid-liquid interface due to rotation of a growing crystal, preferably by choosing ① an inner diameter of a cylindrical body to a diameter of a straight part of a growing crystal (an inner diameter of 5 to 30 mm larger than the diameter of the straight drum part), ② a depth of a liquid encapsulant during growth of a straight part, ③ an immersion depth in a liquid encapsulant of a cylindrical body and ④ a rotating direction and rotation rate of a cylindrical body to rotations of a crucible and growing crystal, so that the influence of rotation of the crucible upon rotation of the liquid encapsulant may be suppressed.

The above described factors to be controlled are preferably selected from the following ranges to control the convection of the raw material melt and prevent the solid-liquid interface from becoming concave, so that polycrystallization may be prevented and a high quality single crystal with a small dislocation density may be pulled. Namely, these effects can be obtained by adjusting the inner diameter of a cylindrical body to larger by 5 to 30 mm, preferably 5 to 20 mm than the predetermined diameter of straight drum part of the growing crystal, the distance from the raw material melt to the end of the cylindrical body immersed in the liquid encapsulant to at most 30 mm, preferably at most 10 mm, the rotation rate of the crucible to at least 5 rpm, preferably 10 to 30 rpm, the relative rotation rate of the growing crystal, i.e. pulling rod to the cylindrical body to 0 to 5 rpm, preferably 0 to 3 rpm and the relative rotation rate of the cylindrical body to the crucible to at least 5 rpm, preferably 10 to 30 rpm.

In the present invention, in general, arrangement of the above described cylindrical body can be carried out by methods comprising ① floating the cylindrical body on a raw material melt, ② fixing and supporting the cylindrical body independently of a crucible and growing crystal, ③ rotating the cylindrical body with a pulling shaft as one body and ④ rotating the cylindrical body independently of a crucible and growing crystal.

The floating method ① has an advantage that the above described immersion depth can be maintained constant by controlling the weight and shape of a cylindrical body. On the other hand, since the cylindrical body is floated on the raw material melt and rotated with a liquid encapsulant, the cylindrical body cannot generate a forced convection. Thus, this method is effective only in the case of immersing the cylindrical body in the raw material melt. Even in the floating method, it is preferable to maintain the cylindrical body at the center by a stanchion, etc. so that the cylindrical body be in agreement with the central axis of a crucible.

Figure 6:
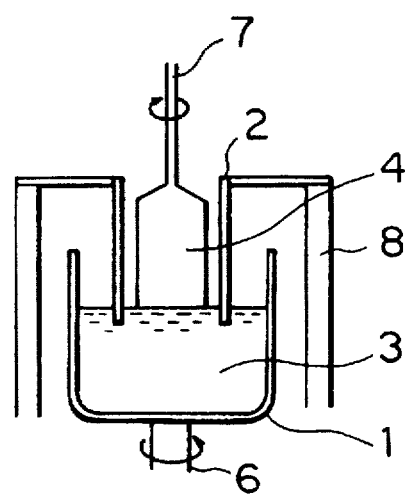
FIG. 6 is a schematic view illustrating one embodiment of the cylindrical body of the present invention supported by a heat insulator.
Figure 8:
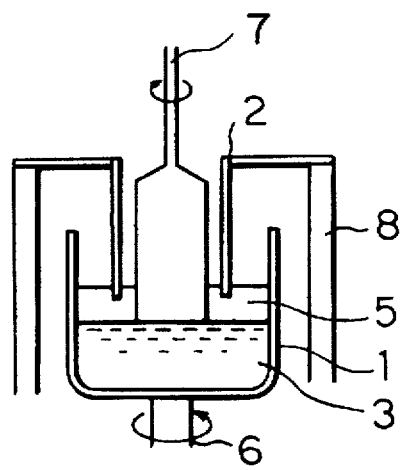
FIG. 8 is a schematic view illustrating another embodiment of the cylindrical body of the present invention supported by a heat insulator.

② In the method of fixing and supporting the cylindrical body independently of a crucible and growing crystal, the upper end of the cylindrical body 2 is fixed to a non-movable part 8 such as insulator in a chamber, as shown in FIG. 6 or 8. In this case, it is required so as to maintain the immersion depth of the cylindrical body constant by raising the lower shaft 6 with the same rate as the decreasing rate of the melt depth. This method gives a larger convection controlling effect as compared with the above, described method ①.

Figure 7:
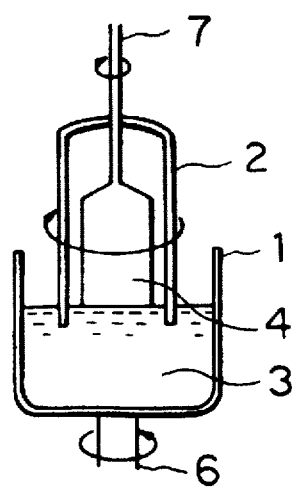
FIG. 7 is a schematic view illustrating one embodiment of the cylindrical body of the present invention supported by the an upper pulling rod.
Figure 9:
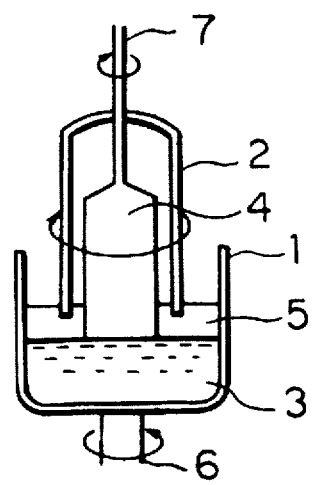
FIG. 9 is a schematic view illustrating another embodiment of the cylindrical body of the present invention supported by the an upper pulling rod.
Figure 10:
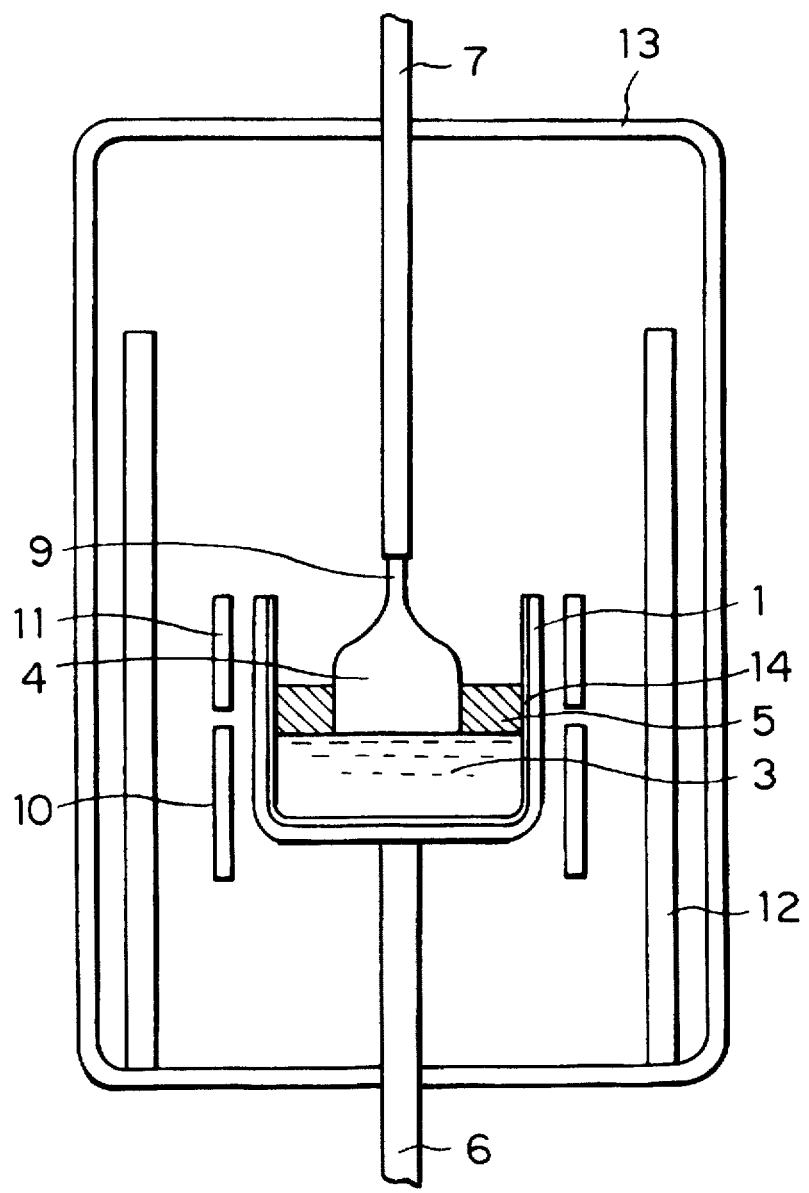
FIG. 10 is a vertical cross-sectional view of an apparatus for practicing the LEC method in the prior art.
Figure 11:
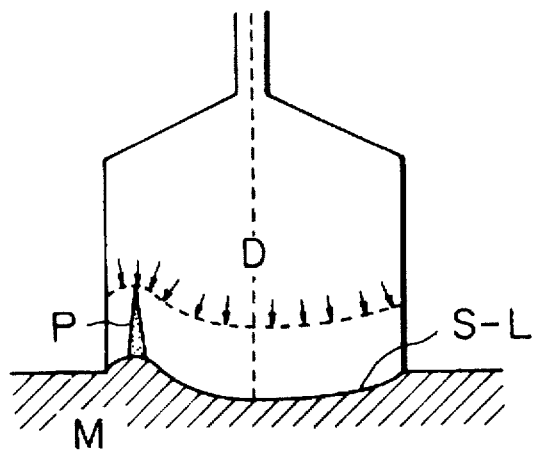
FIG. 11 is a schematic view illustrating a state of polycrystallization in the solid-liquid interface in the prior art.

③ In the method of rotating the cylindrical body with a pulling rod as one body, the upper end of the cylindrical body 2 is supported by the upper pulling rod 7 and it is required to provide a mechanism for moving downward the cylindrical body 2 with pulling upward the growing crystal, as shown in FIG. 7 or 9. When the cylindrical body is rotated with the crystal, the effect of controlling the convection is larger near the solid-liquid interface.

④ In the method of rotating the cylindrical body independently of a crucible and growing crystal, in particular, the cylindrical body is rotatably supported independently of the crucible and growing crystal and a desired convection can be obtained by suitably selecting the rotation rate of the three rotatable components.

Figure 16:
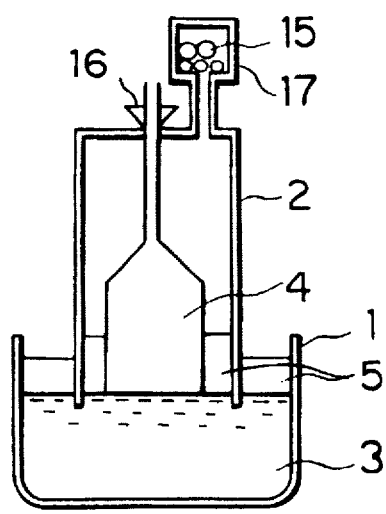
FIG. 16 is a schematic view of an apparatus for the growth of a crystal, comprising the cylindrical body of the present invention, connected with an As reservoir.
Figure 20:
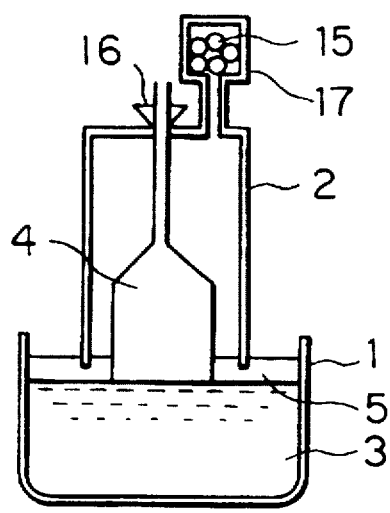
FIG. 20 is a schematic view of an apparatus for the growth of a crystal, comprising the cylindrical body of the present invention, connected with a reservoir of a Group V element raw material.

On the other hand, a single crystal with high quality can be obtained, even when the crystal is grown under the low the temperature gradient at the solid-liquid interface, using a cylindrical body 2 whose upper end is closed, to which a reservoir 17 for holding a volatile element 15 constituting the growing crystal 4 is connected to be gas-passable, by controlling the power of a heater (not shown) arranged round the reservoir and controlling the vapor pressure of the volatile element in the cylindrical body to prevent evaporation of the volatile element from the growing crystal, as shown in FIG. 16 or FIG. 20. In the present invention, as another means, an air-tight vessel can be used for covering the whole of a crucible, capable of applying a volatile element vapor by providing a valve mechanism, but in a preferable embodiment, control of the vapor pressure can be carried out without needing such a large sized air-tight vessel by providing the closed cylindrical body with a relatively simple structure such as the above described reservoir.

The shape of the cylindrical body used in the present invention is generally circular in cross section, but in the growth of a crystal with a strong crystal habit, a casing having a cross-sectional shape as that of the growing crystal is used and in the growth of a crystal for cutting a wafer in a direction not perpendicular to the growth axis, a casing having an oval shape in cross section is used.

The cylindrical body used in the present invention can be made of carbon, PBN, quartz and the like.

Advantages of the Invention

As illustrated above, according to the present invention, the growing crystal can be prevented from becoming concave at the periphery of the solid-liquid interface and from polycrystallization due to accumulation of dislocations. Furthermore, control of the diameter of the growing crystal can well be carried out and the yield of the crystal can largely be improved.

The following examples are given in order to illustrate the invention in detail without limiting the same.

EXAMPLES

Example 1

GaAs single crystal was grown floating a cylindrical body on a raw material by the LEC method. When a predetermined diameter of straight part of the growing crystal was adjusted to 110 mm and the cylindrical body made of pBN, having an inner diameter of 120 mm and a thickness of 1 mm was floated on the raw material melt, there was obtained an immersion depth of 10 mm in the raw material melt.

10 kg of GaAs raw material and 500 g of $B_2O_3$ were charged in a crucible of pBN, having a susceptor of carbon and an inner diameter of 200 mm, and subjected to growth of the single crystal by adjusting the rotation rate of the crucible during growth of the straight part to 10 rpm, the rotation rate of a seed crystal to 2 rpm in the opposite direction and the pulling-up rate of the same to 5 mm/hr.

Figure 12:
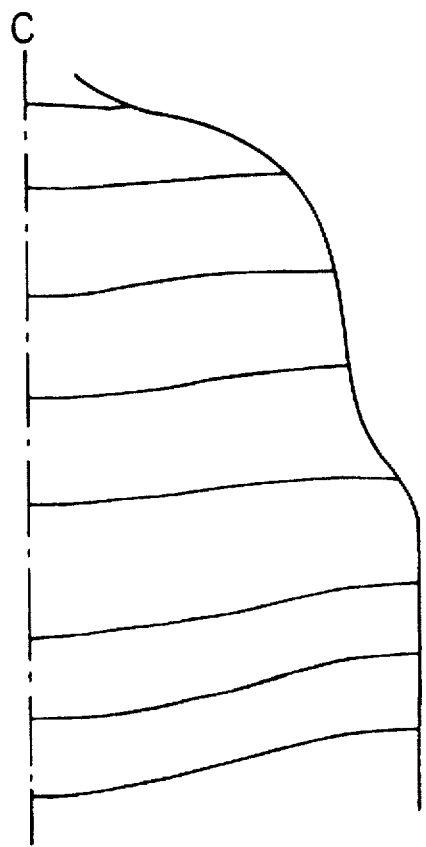
FIG. 12 is a schematic view showing growth striations of a crystal obtained in Example 1.

The thus resulting crystal was a single crystal having a length of 200 mm and a maximum diameter of 110 mm. When the crystal was sliced along the growth axis and subjected to observation of the growth striations revealed by photo A/B etching, i.e. immersing the resulting wafer in an etching solution containing 40 ml of 50% HF, 100 g of $CrO_3$ and 520 ml of $H_2O$ and effecting etching for 10 minutes while irradiating a light in order to investigate the shape of the solid-liquid interface of the single crystal, they were substantially flat at the periphery part as shown in FIG. 12, from which it was apparent that the periphery part of the solid-liquid interface was prevented from becoming concave. In FIG. 12, C designates the central line.

Example 2

GaAs single crystal was grown in an analogous manner to Example 1 except rotating the cylindrical body 2 with the same rotation rate the pulled crystal 4 by the upper pulling rod 7 as shown in FIG. 7. The upper pulling rod, whose cross section was not circular, was set in a hole having the same shape as the upper pulling rod in cross section, made on the upper part of the cylindrical body so that the rotation of the upper pulling rod was transmitted to the cylindrical body. The cylindrical body was supported by an insulator so that it was not vertically moved. The immersion depth of the cylindrical body was maintained constant by moving upward the lower shaft at the same rate as the decreasing rate of the depth of the raw material melt with growth of the crystal.

Figure 13:
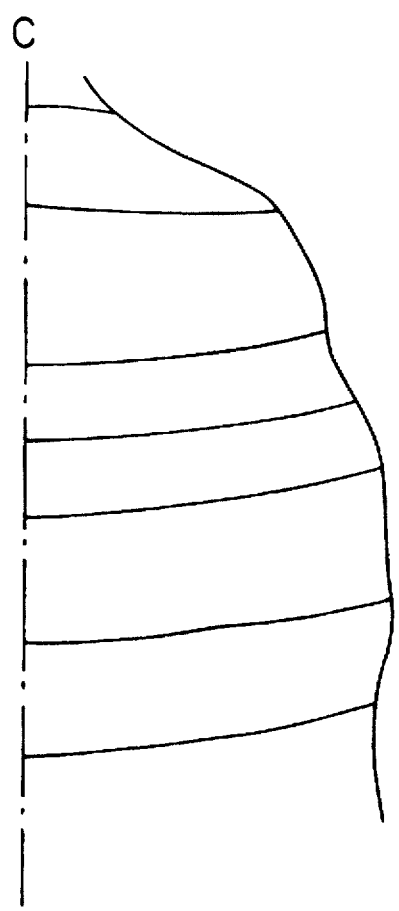
FIG. 13 is a schematic view showing growth striations of a crystal obtained in Example 2.

The thus resulting crystal was a single crystal having a length of 210 mm and a maximum diameter of 108 mm. When the growth striations were observed in the same manner as Example 1, there was a tendency of becoming convex at the periphery part of the solid-liquid interface, as shown in FIG. 13, which taught the effect of a forced convection by the cylindrical body.

Comparative Example 1

GaAs single crystal was grown in an analogous manner to Example 1 except omitting the cylindrical body.

Figure 14:
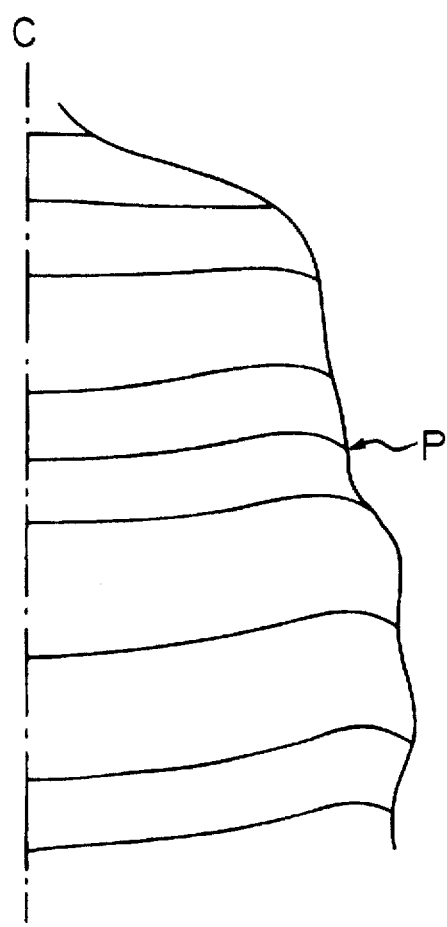
FIG. 14 is a schematic view showing growth striations of a crystal obtained in a Comparative Example (the LEC method in the prior art).

The thus resulting crystal was a single crystal having a length of 200 mm and a maximum diameter of 111 mm. When the growth rings were observed in the same manner as Example 1, there were a remarkable tendency of becoming concave at the periphery part of the solid-liquid interface and polycrystallization from a position marked by an arrow P, as shown in FIG. 14.

Comparative Example 2

When the inner diameter of the cylindrical body was rendered smaller than the predetermined diameter +5 mm, the diameter of the growing crystal did not reach the predetermined diameter so readily.

On the other hand, when the immersion depth of the cylindrical body in the raw material melt was adjusted to 10 mm and the inner diameter thereof was adjusted to larger by +40 mm than the predetermined diameter, there were a tendency of becoming concave at the periphery part of the solid-liquid interface similarly to Comparative Example 1 and polycrystallization similarly to Comparative Example 1.

Example 3

GaAs single crystal was grown using the same apparatus as that of Example 1 except fixing the cylindrical body 2 to an insulator 8 so that it was not rotated, as shown in FIG. 6. The rotation rate of the crucible was adjusted to 10 rpm and the rotation rate of the growing crystal was adjusted to 2 rpm.

The thus resulting crystal was a single crystal having a length of 200 mm and a maximum diameter of 110 mm. When the growth striations were observed in the same manner as Example 1, the shape of the periphery part of the solid-liquid interface was found to be on the order between those of Examples 1 and 2.

Figure 15:
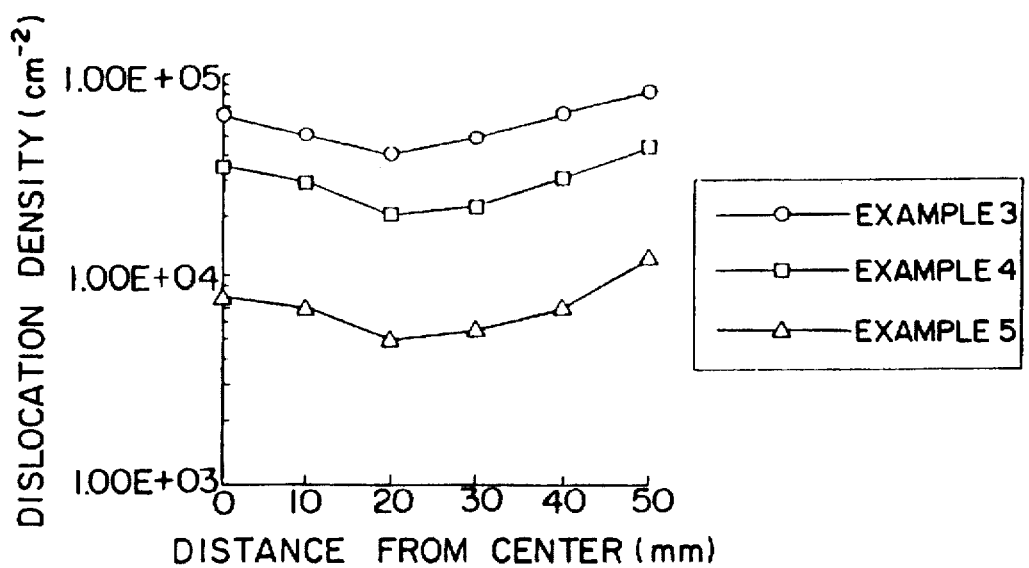
FIG. 15 is a graph showing radial distributions of dislocation density in wafers cut out of crystals obtained in Examples 3, 4 and 5.

A wafer (100) was quarried out of the resulting crystal, etched with melted KOH and subjected to examination of radial distribution of the dislocation density in plane to obtain results as shown in FIG. 15 (Curve marked ○). The average value of the dislocation density in plane was 57300 cm$^{-2}$.

Example 4

Growth of a crystal was carried out in an analogous manner to Example 3 except increasing twice the quantity of B$_2$O$_3$ from 500 g to 1000 g. The thickness of B203 in the cylindrical body was about two times as large as that of Example 3 during crystal growth of the straight part.

The thus resulting crystal was a single crystal having a length of 190 mm and a maximum diameter of 113 mm. The average diameter thereof was somewhat large because of rapid growth of the cone part and fluctuation of the diameter was on the same level as in Example 1, resulting in very good controllability of the diameter. A wafer (100) was cut out of the resulting crystal, etched with molten KOH and subjected to investigation of radial distribution of the dislocation density in a wafer to obtain results as shown in FIG. 15 (Curve marked □) in comparison with Example 3. With increase of the thickness of B203, the temperature gradient in the direction of the growth-axis was decreased and consequently, the dislocation could be decreased. The average value of the dislocation density in plane was 29700 cm$^{-2}$, less than that of Example 3.

Example 5

Using a cylindrical body 2 whose upper end was closed as shown in FIG. 16, GaAs single crystal 4 was grown in an analogous manner to Example 3 except applying As vapor to the cylindrical body 2 by connecting reservoir 17 of As 15 thereto. The temperature gradient in the direction of the growth axis in B$_2$O$_3$ before growth of the crystal could be suppressed to small, i.e. about 30° C./cm because of the growth under As vapor pressure, as compared with about 100° C./cm in Example 3.

The thus resulting crystal was a single crystal having a length of 220 mm and a maximum diameter of 107 mm. When GaAs single crystal was grown under a low temperature gradient, in general, as element was evaporated, but the GaAs single crystal obtained herein had a surface with a metallic luster and there was found no evaporation of As. Because of the low temperature gradient, the solid-liquid interface at the central part became convex to a small extent, but the periphery part of the solid-liquid interface was hardly changed from Example 3.

A wafer (100) was cut out of the resulting crystal, etched with molten KOH and subjected to investigation of radial distribution of the dislocation density in a wafer to obtain results as shown in FIG. 15 (Curve marked △). The average value of the dislocation density in plane was 7420 cm$^{-2}$, which was further decreased from that of Example 4.

Comparative Example 3

In Example 3, the rotation rate of the crucible was maintained constant at 10 rpm and that of the crystal was changed to investigate the effect of the relative rotation rate of the crystal and cylindrical body on controllability of the diameter. Namely, when the rotation rate of the crystal was increased from 2 rpm to 5 rpm in opposite direction to revolution of the crucible, a force the meniscus took from the cylindrical body was too large and a part of the meniscus fell during growth of the crystal.

When the rotation of the crystal was stopped, on the other hand, the force the meniscus took was too small and the crystal was grown until the diameter of the crystal was brought into contact with the cylindrical body. Falling of the meniscus is a phenomenon such that a part of the crystal is cut from the melt to form a scoop on the growing crystal.

Example 6

In Example 3, using a cylindrical body of pBN, the outer surface of which was coated with a carbon heater, the cylindrical body was heated and the rotation rate of the crystal was adjusted to 5 rpm to obtain similar results to Comparative Example 3. Even if the crystal growth was carried out while stopping the rotation thereof, the diameter of the crystal was not changed and there was found no contact with the cylindrical body.

Example 7

GaAs single crystal was grown by the LEC method using a growth apparatus as shown in FIG. 8, in which the cylindrical body 2 was fixed to an insulator 8. When a predetermined diameter of straight part of the growing crystal was adjusted to 110 mm and the cylindrical body made of pBN, having an inner diameter of 120 mm and a thickness of 1 mm was used.

10 kg of GaAs raw material and 800 g of a liquid encapsulant, $B_2O_3$ were charged in a crucible of pBN, having an inner diameter of 200 mm, and subjected to growth of the single crystal, with a thickness of the liquid encapsulant, $B_2O_3$ of about 23 mm during growth of the straight part, by adjusting the rotation rate of the crucible during growth of the straight part to 10 rpm, the rotation rate of a seed crystal to 2 rpm and, the pulling-up rate of the same to 5 mm/hr. The end of the cylindrical body was arranged to be in the liquid encapsulant apart from the raw material melt by 5 mm.

Figure 17:
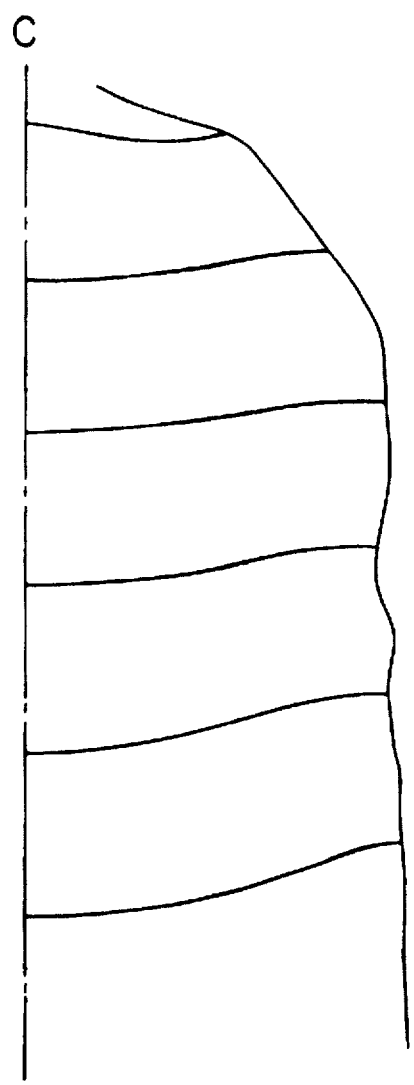
FIG. 17 is a schematic view showing growth striations of a crystal obtained in Example 7.

The thus resulting crystal was a single crystal having a length of 210 mm and a mean diameter of 108 mm. When the crystal was sliced along the growth axis and subjected to observation of the growth rings by photo A/B etching, i.e. immersing the resulting wafer in an etching solution containing 40 ml of 50% HF, 100 g of $CrO_3$ and 520 ml of $H_2O$ and effecting etching for 10 minutes while irradiating a light in order to investigate the shape of the solid-liquid interface of the single crystal, they were substantially flat at the periphery part as shown in FIG. 17, from which it was apparent that the periphery part of the solid-liquid interface was prevented from becoming concave.

Figure 19:
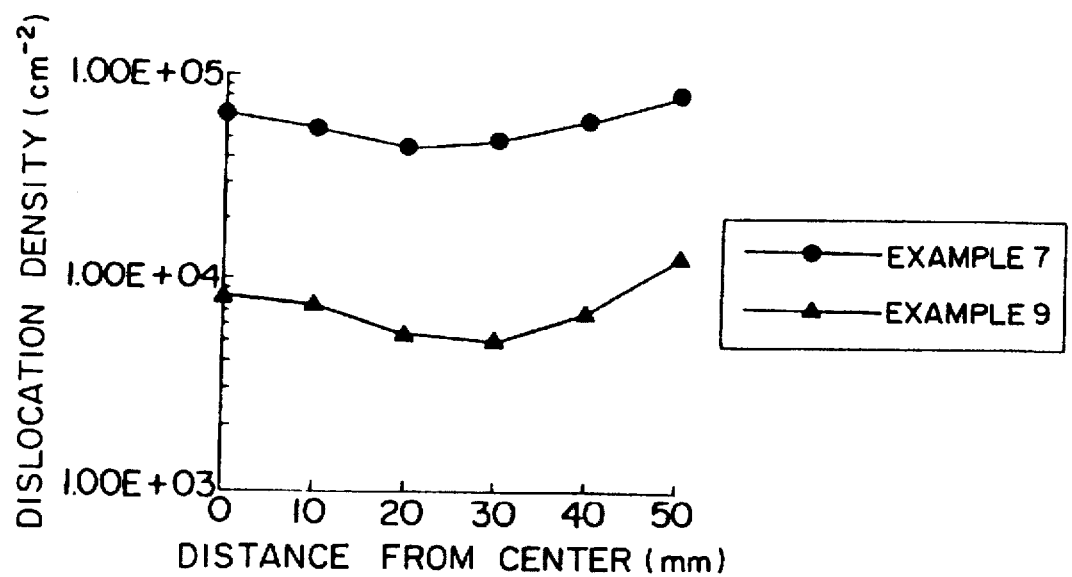
FIG. 19 is a graph showing radial distributions of dislocation density in wafers cut out of crystals obtained in Examples 7 and 9.

A wafer (100) was cut out of the resulting crystal, etched with molten KOH and subjected to investigation of radial distribution of the dislocation density in a wafer to obtain results as shown in FIG. 19 (Curve marked ●). The average value of the dislocation density in plane was 58800 $cm^{-2}$.

Example 8

GaAs single crystal was grown in an analogous manner to Example 7 except rotating the cylindrical body 2 with the same rotation rate of the growing crystal 4 as shown in FIG. 9. The upper pulling rod, whose cross section was not circular, was set in a hole having the same shape as the upper pulling rod in cross section, made on the upper part of the cylindrical body so that the rotation of the upper pulling rod was transmitted to the cylindrical body. The cylindrical body was supported by an insulator so that it was not vertically moved. The relationship of the end of the cylindrical body and the surface of the raw material melt was maintained constant by moving upward the lower shaft at the same rate as the decreasing rate of the depth of the raw material melt with growth of the crystal.

Figure 18:
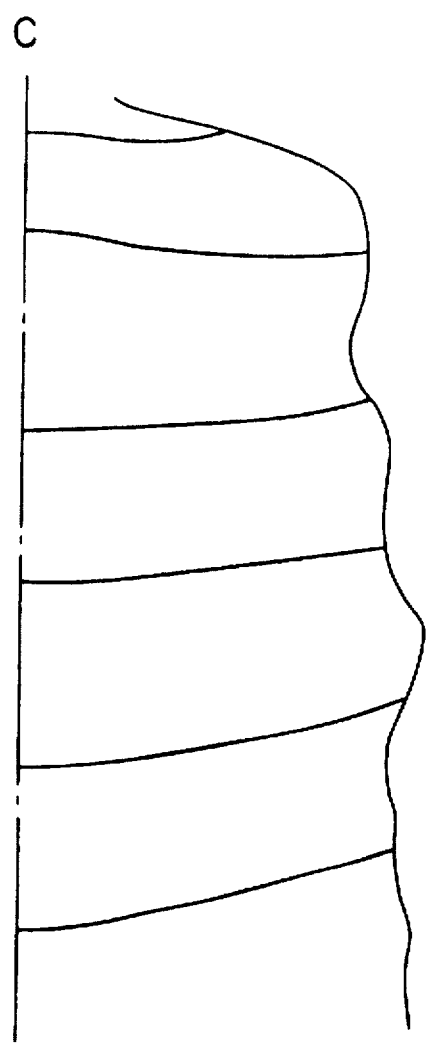
FIG. 18 is a schematic view showing growth striations of a crystal obtained in Example 9.

The thus resulting crystal was a single crystal having a length of 200 mm and a mean diameter of 110 mm. When the growth rings were observed in the same manner as Example 7, there was a tendency of becoming convex at the periphery part of the solid-liquid interface, as shown in FIG. 18.

Comparative Example 4

GaAs single crystal was grown in an analogous manner to Example 7 except omitting the cylindrical body.

The thus resulting crystal was a single crystal having a length of 200 mm and a maximum diameter of 111 mm. When the growth striations were observed in the same manner as Example 7, there were a remarkable tendency of becoming concave at the periphery part of the solid-liquid interface and polycrystallization from a position marked by an arrow P, as shown in FIG. 14.

Comparative Example 5

When using a cylindrical body whose inner diameter was the predetermined diameter of the growing crystal +5 mm in Example 7, the crystal was substantially grown to the limit of the cylindrical body due to fluctuation of the diameter of the crystal and brought into contact with the cylindrical body. Thus, the crystal growth could not be continued.

When using a cylindrical body whose inner diameter was the predetermined diameter of the growing crystal +40 mm, there was found a tendency of becoming concave at the periphery of the solid-liquid interface and polycrystallization occurred.

Moreover, when the cylindrical body was fixed to a heat insulator and the crucible and crystal were rotated respectively at 5 rpm and 2 rpm, the tendency of becoming concave at the periphery of the solid-liquid interface was somewhat improved, but there was still remained a tendency of becoming concave.

Moreover, when the cylindrical body was fixed to a heat insulator and the crucible and crystal were rotated respectively at 10 rpm and 5 rpm, the tendency of becoming concave at the periphery of the solid-liquid interface was somewhat improved, but there was still remained a tendency of becoming concave.

Example 9

Using a cylindrical body 2 whose upper end was closed as shown in FIG. 20, GaAs single crystal 4 was grown in an analogous manner to Example 7 except applying As vapor to the cylindrical body 2 by connecting reservoir 17 of As 15 thereto. The temperature gradient in the direction of the growth axis in $B_2O_3$ before growth of the crystal could be suppressed to small, i.e. about 30° C./cm because of the growth under As vapor pressure, as compared with about 100° C./cm in Example 7.

The thus resulting crystal was a single crystal having a length of 215 mm and a mean diameter of 107 mm. When GaAs single crystal was grown under a low temperature gradient, in general, As element was evaporated, but the GaAs single crystal obtained herein had a surface with a metallic lustre and there was found no evaporation of As. Because of the low temperature gradient, the solid-liquid interface at the central part became convex to a small extent, but the periphery part of the solid-liquid interface was hardly changed from Example 7.

A wafer (100) was cut out of the resulting crystal, etched with molten KOH and subjected to investigation of radial distribution of the dislocation density in a wafer to obtain results as shown in FIG. 19 (Curve marked ▲). The average value of the dislocation density in plane was 7750 $cm^{-2}$.

Example 10

In Example 7, using a cylindrical body of pBN, the outer surface of which was coated with a carbon heater, the cylindrical body was heated and the other conditions were maintained similar to Example 7. Consequently, the tendency of becoming concave at the periphery of the solid-liquid interface was more improved than in Example 7 and there was found a tendency of becoming convex, similarly to FIG. 18. This effect is probably due to that heat flow from the crystal to the side is suppressed by heating the cylindrical body.

What is claimed is:

1. An apparatus for growing a single crystal, comprising:
a crucible for holding a raw material melt, a lower shaft supporting said crucible for rotating and vertically moving said crucible, an upper pulling rod having a lower end for supporting a seed crystal disposed in said crucible and for rotating and vertically moving the seed crystal in and out of said crucible, a means for controlling the rates of rotating and vertically moving said upper pulling rod and lower shaft, and a cylindrical body having an inner diameter which is larger than a diameter of the single crystal to be grown from the seed crystal, said cylindrical body being supported for immersing in the raw material melt or a liquid encapsulant and for shielding the growing crystal from convection currents.

2. The apparatus as claimed in claim 1, wherein said cylindrical body has a lower end which is tapered inwardly.

3. The apparatus as claimed in claim 1, wherein said cylindrical body has a weight and shape which is controlled so that said cylindrical body is floated on the raw material melt to satisfy the immersion condition.

4. The apparatus as claimed in claim 1, wherein said cylindrical body is supported so as to be rotatable with said upper pulling rod.

5. The apparatus as claimed in claim 1, wherein said cylindrical body is supported so as to be rotatable independently of said upper pulling rod and lower shaft.

6. The apparatus as claimed in claim 1, wherein the cylindrical body is fixed to a non-movable part of said apparatus.

7. The apparatus as claimed in claim 1, wherein said cylindrical body has a cross-sectional shape corresponding to that of the growing crystal.

8. The apparatus as claimed in claim 1, wherein said cylindrical body is oval shaped in cross section.

9. The apparatus as claimed in claim 1, wherein said cylindrical body includes a means for heating.

10. The apparatus as claimed in claim 1, wherein said cylindrical body has a closed upper end for holding a volatile element under pressure.

* * * * *